(12) United States Patent
Vogel et al.

(10) Patent No.: US 10,783,492 B2
(45) Date of Patent: Sep. 22, 2020

(54) AUTOMOTIVE FITMENT VALIDATION SYSTEM AND METHOD

(71) Applicant: OSCARO, Paris (FR)

(72) Inventors: Claude Vogel, Paris (FR); Gabriel Gautron, Paris (FR); Nils Grunwald, Paris (FR); Pierre-Noel Luiggi, Paris (FR)

(73) Assignee: OSCARO, Paris (FR)

( * ) Notice: Subject to any disclaimer, the term of this patent is extended or adjusted under 35 U.S.C. 154(b) by 524 days.

(21) Appl. No.: 15/478,014

(22) Filed: Apr. 3, 2017

(65) Prior Publication Data

US 2018/0285815 A1  Oct. 4, 2018

(51) Int. Cl.
| | | |
|---|---|---|
| *G06F 7/00* | (2006.01) | |
| *G06Q 10/08* | (2012.01) | |
| *G06Q 10/00* | (2012.01) | |
| *G06Q 30/06* | (2012.01) | |
| *G06Q 50/30* | (2012.01) | |
| *G06N 5/02* | (2006.01) | |
| *G06F 30/15* | (2020.01) | |

(52) U.S. Cl.
CPC ....... *G06Q 10/0875* (2013.01); *G06Q 10/087* (2013.01); *G06Q 10/20* (2013.01); *G06Q 30/0627* (2013.01); *G06Q 50/30* (2013.01); *G06F 30/15* (2020.01); *G06N 5/022* (2013.01)

(58) Field of Classification Search
USPC .......................................................... 707/690
See application file for complete search history.

(56) References Cited

U.S. PATENT DOCUMENTS

| | | | |
|---|---|---|---|
| 2013/0036029 A1* | 2/2013 | Patt .................... | G06Q 30/0283 705/27.1 |
| 2013/0041786 A1 | 2/2013 | Adegan | |
| 2014/0074865 A1 | 3/2014 | Zobrist et al. | |
| 2016/0078403 A1 | 3/2016 | Sethi et al. | |
| 2017/0185646 A1* | 6/2017 | Mandala ............. | G06F 11/3668 707/707 |

* cited by examiner

*Primary Examiner* — Alexandria Y Bromell

(57) ABSTRACT

A fitments validation system and method for automotive parts are provided in which the fitments vehicles to the parts in a PIM are validated.

8 Claims, 18 Drawing Sheets

```
Brake Assembly
    ABS Assembly
            APID1584::ABS Actuator Assembly
            ABS Cable Assembly
                    APID11503::ABS Cable Bracket
                    APID11504::ABS Cable Harness
```

FIGURE 3

```
APID1836::Brake Master Cylinder
      APID15144::Brake Master Cylinder Access Plate
      APID20813::Brake Master Cylinder Adapter
      APID20755::Brake Master Cylinder Diaphragm
      APID20756::Brake Master Cylinder Line
      APID20758::Brake Master Cylinder Piston
      APID11510::Brake Master Cylinder Plug
      APID13261::Brake Master Cylinder Reservoir
```

FIGURE 4

```
General Properties
        Adjustment
                SYN:fr::Ajustable
                SYN:fr::Ajustement
                Adjustment Type
                        SYN:fr::Mode d'Ajustement
                        UNI::Bool
                        VAL::[Manual,Auto]
                        Auto Adjustment
                                SYN::Without Manual Adjustment
                                SYN::Automatic Adjustment
                                SYN::Integrated Correction
                                SYN:fr::Ajustement Automatique
                        Manual Adjustment
                                SYN::Without Automatic Adjustment
                                SYN::Without Auto Adjustment
                                SYN:fr::Ajustement Manuel
        Tuning
                SYN:fr::Type de Réglage
                SYN:fr::Réglage
                VAL::[Tuning Valve,Tuning Screw]
                Tuning Valve
                        SYN:fr::Vanne de Réglage
                Tuning Screw
                        SYN:fr::Vis de Réglage
                Réglage de la rainure
        un::Rectification
                SYN:un::Correction
                VAL::[Minimum,Maximum]
                Cotes maximum de rectification
                        SYN:fr::Cotes max.de rectification
                        UNI::mm
```

FIGURE 5

```
Quantity
        Number of Disc Brake Pads
        Number of Teeth, ABS ring
```

FIGURE 7

```
Disc Brake
        Number of Teeth, ABS ring
        Thickness
        Etc.
Etc.
```

FIGURE 8

```
ACID3::Brake
        PRP::Type of Brakes
        CST::Engine|Engine Output HP
        CST::Vehicle|Vehicle Type
        CST::Vehicle|Weight
        CST::Vehicle|Bed Type
        CST::Vehicle|Body Type
        CST::Steering Wheel|Position
        CST::Vehicle|Track
        CST::Vehicle|Options
        CST::Vehicle|Drive Wheel Configuration
        CST::Suspension|Suspension Type
        CST::Axle|Axle Type
        CST::Brake Hydraulic Line|Brake Hydraulic Line Type
        CST::Transmission|Number of Gears
        CST::Transmission|Transmission Type
        CST::Wheel Rim|Size
        CST::Wheel|Diameter
        CST::Wheel|Number Of Holes
        CST::Wheel|Centre-to-centre distance
        ABS
                APID10176::ABS Ring
                        SYN:fr::Couronne ABS
                        PRP::Number of Teeth
                etc.
        etc.
    etc.
```

FIGURE 9

```
{
        "_id" : ObjectId("5537842482437e1520d45ff6"),
        "has_prp" : [
                {
                        "property_id" : "121368",
                        "property" : "diameter"
                },
                etc.
        ],
        "has_cst" : [
                {
                        "property_id" : "122151",
                        "target_id" : "103935",
                        "target" : "abs ring",
                        "property" : "teeth"
                }
        ],
        "has_ctm" : [
                {
                        "ctm" : "disc brake criteria"
                }
                "name" : "disc brakes",
        ],
        "name" : "disc brakes",
        Etc.
}
```

FIGURE 10

```
{
    "_id" : ObjectId("5613e47882437e2b2caa10dd"),
    "vehicle_ids" : {
        "tecdoc" : {
            "TypeMine" : "",
            "KBA" : "0035AFR",
            "KTypNr" : "1",
            "EngineCode" : "",
            "PolkVehicleId" : "na",
            "YMM" : {
                "model" : "CORSA",
                "start_year" : 2006,
                "start_month" : 7,
                "make" : "OPEL",
                "end_month" : 0,
                "end_year" : 0
            }
        }
    },
    "origin" : "tecdoc",
    "region" : {
    },
    "properties" : [
        {
            "property" : {
                "property_id" : "122086",
                "property_name" : "engine type",
                "tecdoc_name" : "MotArt"
            },
            "value" : {
                "value_id" : "001",
                "value_name" : "Petrol Engine"
            },
            "target" : {
                "target_name" : "engine",
                "target_id" : "116849"
            }
        },
        etc.
    ],
    "vehicle_name" : "1.4",
    "base_vehicle" : {
        "base_vehicle_id" : "84569820060",
        "model" : {
            "model_name" : "CORSA D",
            "model_id" : 5598,
            "vehicle_type" : {
                "vehicle_type_id" : "na",
                "vehicle_type_name" : "PC"
            }
        },
        "year" : {
            "end_month" : 0,
            "end_year" : 0,
            "start_year" : 2006,
            "start_month" : 7
        },
        "make" : {
            "make_name" : "OPEL",
            "make_id" : 84
        }
    },
    "vehicle_type_id" : "1"
}
```

FIGURE 11

```
{
  "_id" : ObjectId("5613e55f82437e19286b1e6b"),
  "genart" : {
    "genart_name" : "régulateur de freinage",
    "genart_cid" : "108050",
    "genart_label" : {
      "fr" : {
        "preferred" : "Régulateur de freinage"
      }
    }
  },
  "part_id" : "03.0101-0014.2",
  "supplier" : "CONTINENTAL TEVES (ATE)",
  "properties" : [
    {
      "target" : {
        "target_name" : "self",
        "target_id" : "na"
      },
      "legacy" : {
        "tecdoc_prop_name" : "Unité quantitative",
        "tecdoc_prop_id" : 680
      },
      "value" : {
        "value_name" : "SA",
        "unit" : "",
        "value_id" : 0
      },
      "property" : {
        "property_id" : "121495",
        "property_name" : "quantity"
```

FIGURE 12A

```
        }
      },
      etc.
    ],
    "fitment" : {
      "constraints" : [
        {
          "target" : {
            "target_name" : "engine",
            "target_id" : "116849"
          },
          "value" : {
            "value_name" : 60,
            "value_id" : 60
          },
          "property" : {
            "tecdoc_name" : "PS",
            "property_id" : "123439",
            "property_name" : "engine output hp"
          }
        }
      ],
      "region" : {
      },
      "vehicle_id" : "1043",
      "base_vehicle" : {
        "year" : {
          "end_month" : 7,
          "end_year" : 1978,
          "start_month" : 8,
          "start_year" : 1974
        },
        "base_vehicle_id" : "543319741978",
        "model" : {
          "model_id" : 433,
          "model_name" : "50 (86)",
          "vehicle_type" : {
            "vehicle_type_name" : "PC",
            "vehicle_type_id" : "na"
          }
        },
        "make" : {
          "make_name" : "AUDI",
          "make_id" : 5
        }
      },
      "vehicle_name" : "1.1"
    }
  }
}
```

FIGURE 12B

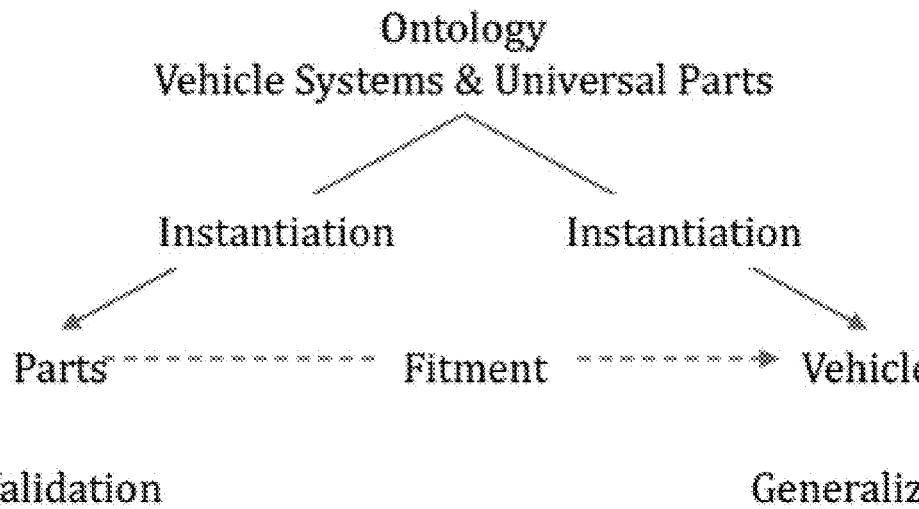

Ontology
Vehicle Systems & Universal Parts

Instantiation        Instantiation

Parts  --------- Fitment  ---------▶ Vehicle

Validation                          Generalization

FIGURE 13

```
Part #12345
     Is a Brake Pad
     Direction = Front
     Material = Ceramic
     etc.
     Fitment: list of vehicles
Part #12346
     Is a Brake Pad
     Direction = Rear
     Material = Ceramic
     etc.
     Fitment: list of vehicles
```

FIGURE 14

```
Part #12345
     Is a Front Brake Pad
     Material = Ceramic
     etc.
     Fitment: list of vehicles
Part #12346
     Is a Rear Brake Pad
     Material = Ceramic
     etc.
     Fitment: list of vehicles
```

FIGURE 15

```
Part #12345
    Is a Brake Pad
    Direction = Front
    Material = Ceramic
    etc.
    Fitment: list of vehicles
Part #12346
    Is a Brake Pad
    Direction = Rear
    Material = Ceramic
    etc.
    Fitment: list of vehicles
```

FIGURE 16

```
BLS BERLINE (C35)
    Model = 1.9 Tid
    etc.
    brake Pad
            Direction = Front
            Thickness = 20.6 mm
            Height = 69.6 mm
            etc.

Direction = Rear
            Thickness = 20.6 mm
            Height = 70.7 mm
            etc.
```

FIGURE 17

```
{
        "_id" : ObjectId("5642128482437e3260061fe8"),
        "name" : "Disc Brake Criteria",
        "genart" : {
                "name" : "disc brakes",
                "c_id" : "114062",
        },
        "numerical" : [
                {
                        "property_name" : "diameter",
                        "property_id" : "119290"
                },
                {
                        "property_name" : "height",
                        "property_id" : "119924"
                }
        ],
        "categorical" : [
                {
                        "property_name" : "disc brake rotor type",
                        "property_id" : "119573"
                },
                {
                        "property_name" : "number of holes",
                        "property_id" : "118874"
                }
        ]
}
```

FIGURE 18A

AUTOMOTIVE FITMENT VALIDATION SYSTEM AND METHOD

FIELD

The disclosure relates generally to a system and method for verifying and validating information about an automotive product.

BACKGROUND

Many industries use some form of an information management system to track and store information about parts or services that may be available for purchase. For example, retail sales and commercial sales industries often have a product information management (PIM) system to organize and store information about parts or services that may be available for purchase to consumers and/or businesses. One such industry is the automotive parts sales industry that sells after-market automotive parts in which a particular part, such as a brake pad, may have a plurality of different types of brake pads that may be sold since each different type of automobile may have slightly different brake pads. Thus, for the automotive parts sales industry, the PIM system may store information about each of the different types of automotive parts, such as brake pads, that may be sold by the automotive parts sales company.

A set of properties associated with each product in the PIM is a best expression of the supplier's parts. However, each property is the least defined part of Product Information Management (PIM) systems. Because of their under-specification and inconsistency, properties are prone to errors and omissions. The PIM also has fitments data associated with the parts wherein the fitments data describe the "fit" between a part and a vehicle. The parts and vehicles are, in that case, instances of generic articles and generic (or "base") vehicles and the generic articles and generic vehicles are defined in the ontology. In the PIM, supplier's information is attached to parts, and parts are attached to vehicles. For any given fitment, some properties of the part constrain the fitment, and some properties of the vehicle constrain the fitment.

If the fitments data is not accurate, then it is not possible to be able to precisely determine a part that fits for a particular vehicle. Thus, it is desirable to be able to validate the fitments and the accuracy of the fitments data.

BRIEF DESCRIPTION OF THE DRAWINGS

FIG. 3 illustrates an example of a taxonomy that may be used for the fitments;

FIG. 4 illustrates an example of a meronymy that may be used for the fitments;

FIG. 5-6 illustrate examples of a properties ontology that may be used for the fitments;

FIG. 7 illustrates an example of a constraint;

FIGS. 8-10 illustrate examples of a property and constraints;

FIG. 11 illustrates an example of vehicle properties;

FIGS. 12A and 12B illustrate an example of a vehicle genart;

FIG. 13 illustrates the relationship between parts, a fitment and a vehicle;

FIGS. 14-16 illustrate examples of an instance property;

FIG. 17 illustrates an example of a vehicle instance;

FIG. 18A illustrates an example of a disc brake criteria model;

DETAILED DESCRIPTION OF ONE OR MORE EMBODIMENTS

The disclosure is particularly applicable to a client server computer architecture system for the automotive industry for fitment validation and it is in this context that the disclosure will be described. It will be appreciated, however, that the system and method has greater utility and is not limited to the client server computer system or the automotive industry described below in the example. For example, the system and method may be used for any industry or technology area or area in which it is desirable to be able to validate a fitment. Furthermore, the system and method may be implemented using other hardware, hardware and software or software architectures such as a cloud based architecture, a software as a service (SaaS) model, a standalone computer system or a computer readable medium that stores a plurality of lines of computer code that implement the functions and operations of the system and method. In order to validate the accuracy of the fitments data, it is necessary to normalize and qualify the relationship between part and fitment, and between vehicle and fitment. In addition, it is also necessary to normalize and qualify properties.

Figure 1:
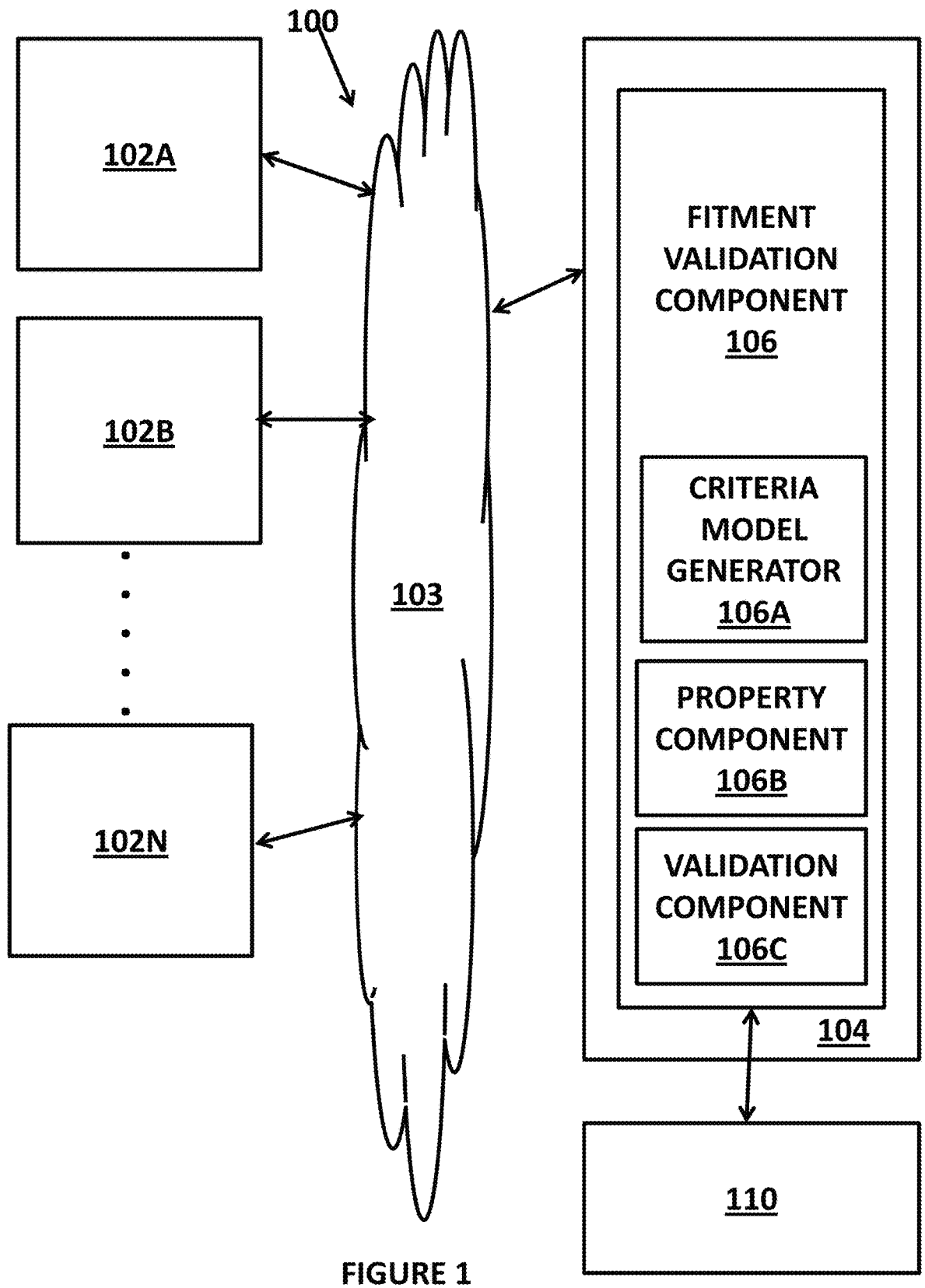
FIG. 1 illustrates an implementation of a system for automotive fitments validation.

FIG. 1 illustrates an implementation of a system 100 for validating an automotive fitment for a product information management (PIM) system for automotive parts. The system may have one or more computing devices or computing resources 102 (such as 102A, 102B, . . . , 102N) that may connect to and communicate over a communications path 103 to a backend system and component 104. For example, each computing device may have a processor and a memory, circuitry for connecting to and communicating with the backend over the communication path 103 and the like. For example, each computing device may be a smartphone device (such as an Apple® iPhone®, an Android® operating system based device, etc.), a tablet computer, a desktop computer, a terminal device and the like. For example, each computing resource may be a storage device or database or other system from which the system may receive data, such as through an application programming interface or other mechanism, that is used to communicate the PIM data for which the fitments may be validated by the system as described below. For example, in the automotive industry example detailed below, the computing resources may include a PIM for an automotive parts supplier who is sending their PIM data to the system 100 so that the system can validate the fitments of the automotive part in the PIM data of the automotive parts supplier. In a client server implementation of the system, each computing device 102 may have an application, such as a browser application, an application or a mobile application, that may be stored in the memory of the computing device and executed by a processor of the computing device to facilitate the exchange of data with the backend system 104 in the form of webpages and the like.

In the system, each computing device or computing resource 102 may couple to and communicate with the backend 104 over the communication path 103 using a known connection and coupling protocol, such as HTTP or HTTPS when a client server system is implemented and various data protocols. The communication path 103 may be a wired computer network, such as Ethernet or the Internet, a wireless computer network, a wireless data communications network, such has WiFi, a wireless cellular data network and the like. The communication path 103 may also be a combination of one or more of the different types of networks described above that allow the computing device/computing resource 102 and the backend 104 to exchange data with each other.

The backend system/component 104 may be implemented using one or more computing resources. For example, the backend system/component 104 may be implemented using one or more server computer and server computing elements or using one or more cloud computing resources. When the backend system/component 104 of the system is implemented as a cloud based architecture, a software as a service (SaaS) model or a standalone computer system, the system and its components would be implemented using well known computer components such as at least a processor and a memory. When the backend component 104 is in a client server system as shown in FIG. 1, the backend component 104 may include a web server (implemented in software or hardware) that manages the connections and exchanges of data with each computing device/computing resource 102, such as by formulating and sending web pages to each computing device/computing resource 102 or gathering data from each computing resource 102.

The backend component 104 may have a connection to a store 110 that may store various data of the system and the backend component. The store 110 may be implemented in hardware or software. The store 110 may store, for example, the code that implements the fitments validation when the fitment validation processes are implemented in software, an automotive parts PIM whose fitments are being validated when the system 100 is integrated into an automotive parts supplier's system and/or PIM data from a third party for which fitments are being validated by the system.

The backend component 104 may further comprise one or more components/modules 106-106C. Each of the components 106-106C may be implemented in software or in hardware. When each component is implemented in software, each component may be a plurality of lines of computer code/instructions stored in a memory and executed by a processor of the computing resource(s) in which the processor is configured to then implement the functions and operations of the components when the lines of code/instructions are executed by the processor. When each component is implemented in hardware, each component may be an ASIC, a programmable logic device, a microcontroller, an integrated circuit and the like.

When the system and its components are implemented on a computer readable medium or on a storage device, each component may be a plurality of lines of computer code. The plurality of lines of computer code may be executed while stored on the computer readable medium or on a storage device. The plurality of lines of computer code also may be downloaded from the computer readable medium or on a storage device to another computer system, stored in a memory of the computer system and executed by a processor of the computer system. The processor of the computer system may be then configured to implement the functions and operations of the components when the lines of code are executed.

The backend component 104 may have a fitment validation component 106 that receives PIM data, such as automotive parts PIM data, and validates the fitments in the PIM data. The PIM may be then re-stored in the store 110. The fitment validation component 106 may further comprise a criteria model generator/retriever 106A, a property component 106B and a validation component 106C. The criteria model generator/retriever 106A may retrieve a particular automotive part and a particular fitment for the particular automotive part to a particular vehicle (from a PIM stored in the store 110, from a third party remote PIM or from PIM data being provided to the system from one of the computing devices 102), retrieve a genart for the particular automotive part and particular vehicle (that contains at least one fitment) and generate or retrieve a criteria model (as example of which is shown in FIG. 18 and described below in more detail. The criteria model contains, for each fitment, a list of categorical and numerical properties of a genart that are deemed the most relevant to assess the accuracy of a fitment related to that genart such as shown in the example in FIG. 18. In one implementation, the criteria model may be generated by a car mechanic.

Figure 19:
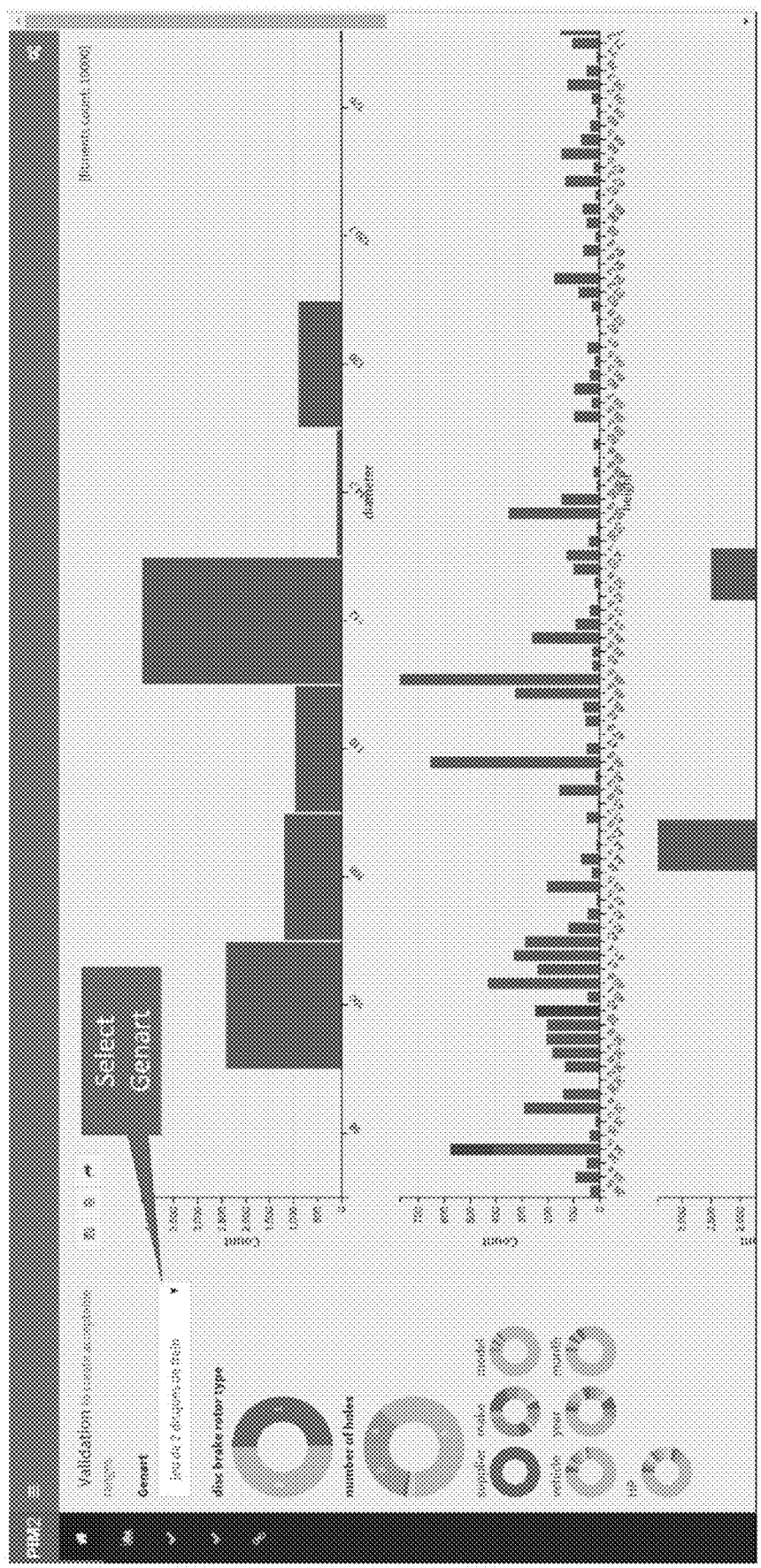
FIGS. 19-21 illustrate examples of a user interface of the system that is used to validate the fitment.
Figure 20:
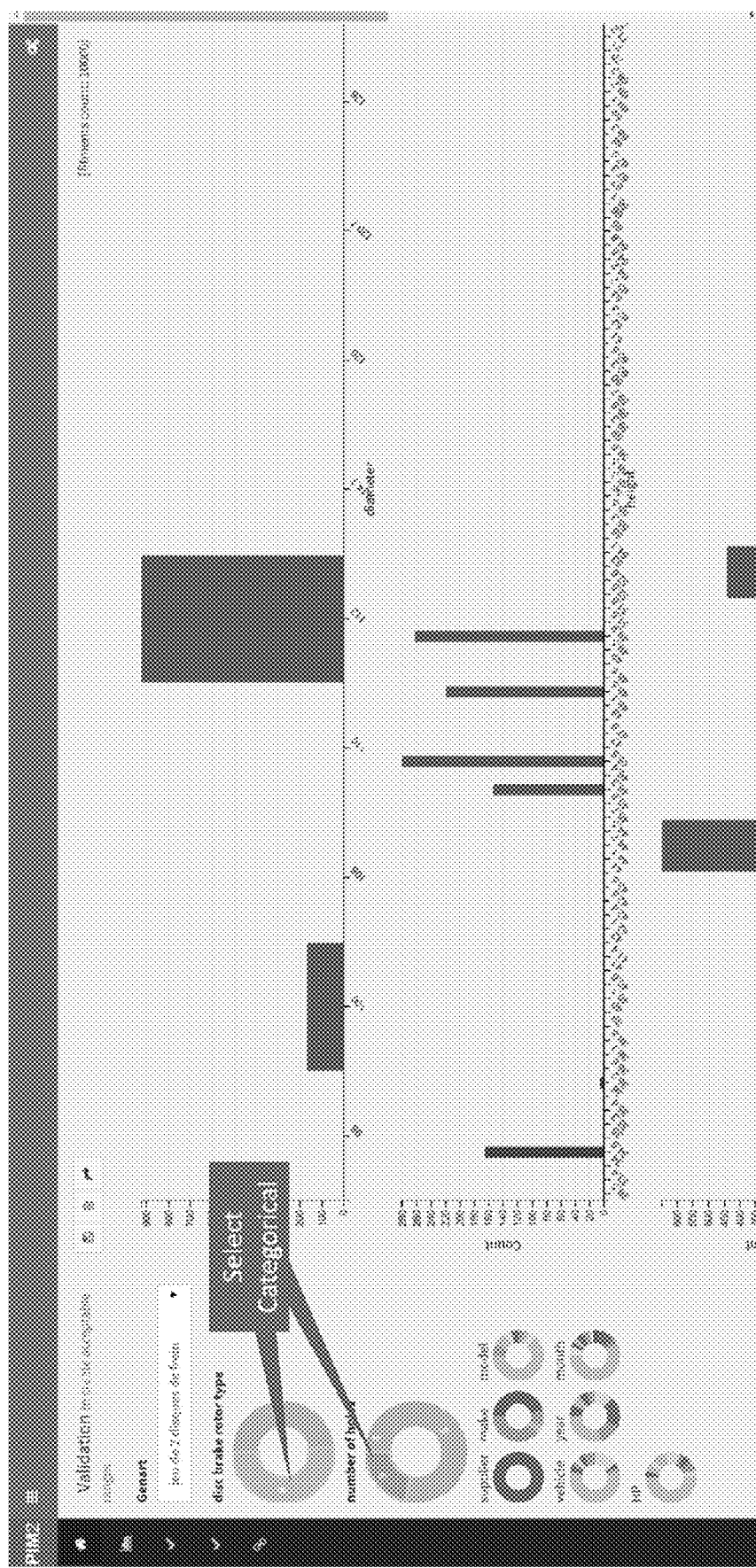
Figure 21:
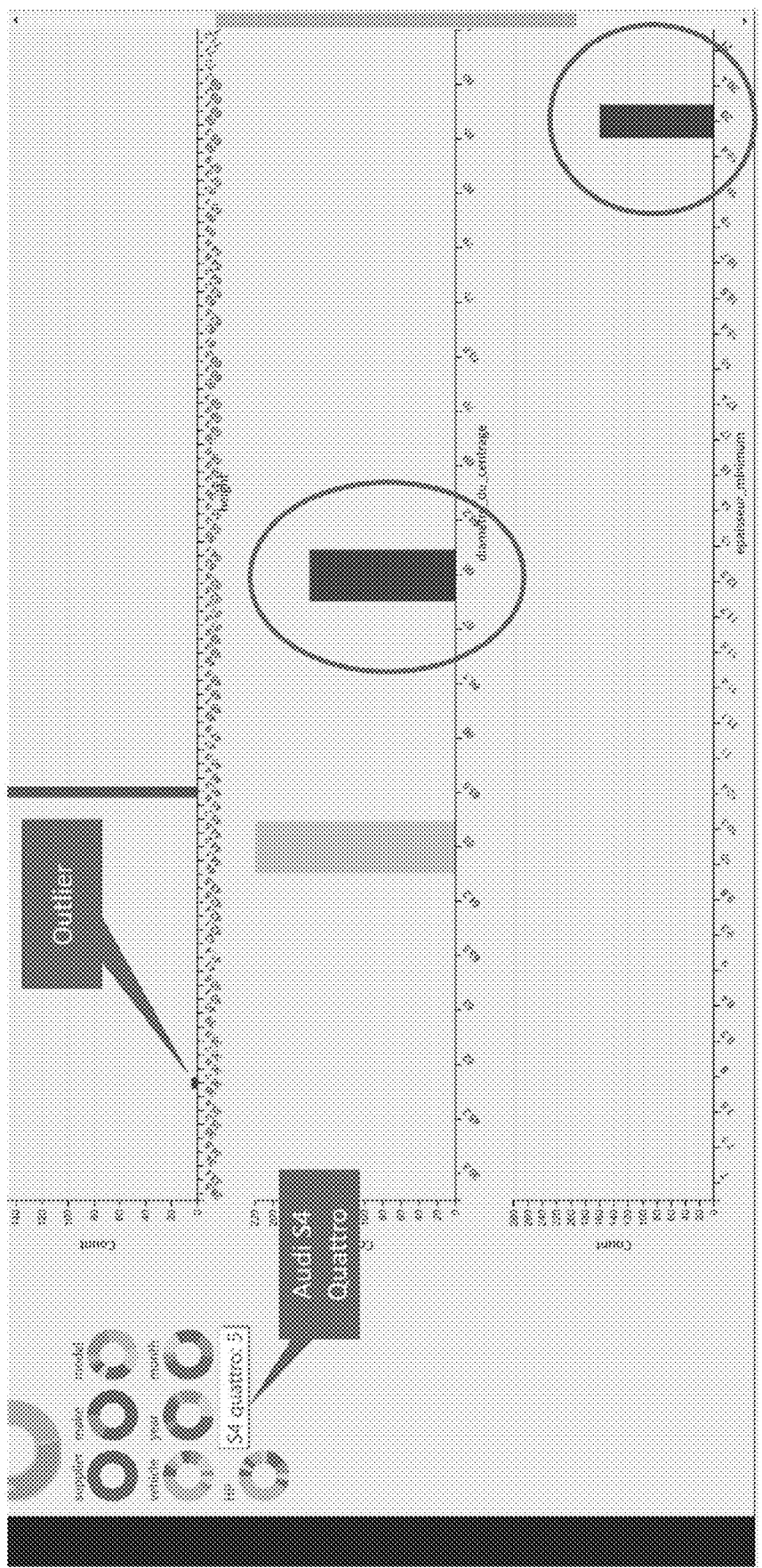

The property component 106B may receive the genart and criteria model for a fitment of the particular product for the particular vehicle and then, select the genart and each property (categorical or numerical) of the genart, based on the criteria model, for analysis. An example of the user interface for performing the process of the property component 106B is shown in FIGS. 19-20. The validation component 106C may detect an outlier in the selected property and fitment and then identify a fitment that is not valid. If no outliers are found for the particular property, then the property and fitment is valid. An example of the user interface for the validation process is shown in FIG. 21. Using the above components, each of the fitments for the data in an automotive PIM may be validated. A validated fitment means that the PIN has data of a part that has a fitment (a fit between the part and a particular vehicle) and the use of that particular part for the particular vehicle is correct. For example, a validated fitment may be that a particular disc brake part is a disk brake part that may be used with a 2014 Audi S4 automobile. If a fitment is not validated, then the PIN has a fitment (use of a particular part for a particular vehicle) that is incorrect and the sale of the particular part for the particular vehicle likely results in a return of the part since the part does not work with the particular vehicle. In some embodiments, the system may identify any invalid fitments to the owner of the PIM so that the invalid fitments for the PIM can be updated. Thus, the system and method are a technical solution (using the elements shown in FIG. 1 and described below to overcome the problems with inaccurate fitments data problem described above.

Ontology Structure

A set of data in the PIM for automotive parts may use an ontology and the ontology may use two basic types of hierarchical relationships: a taxonomy and a meronymy. In both cases, as in the classical model of the thesaurus, the founding relationship links a "Narrower Term" to a "Broader Term", the taxonomy binds the specific to the generic and the meronymy binds the part to the whole.

FIG. 3 illustrates an example of a taxonomy that may be used for the fitments and the PIM. The taxonomy specifies the objects manipulated as categories of more generic classes. This is typical for parts that can be understood as direct instances of a class, without additional complication (i.e. mechanisms): accessories (decor, lighting, and protection), intermediate parts (bearings, gaskets), assembly frames and tools. These parts can be related to various mechanisms and systems (hence the large number of association links across the 2 sides of the ontology), but they are not themselves complex mechanisms. Species are defined by the context of use (fuel pump) or connecting piece (transmission bearing). In the example in FIG. 3, "ABS Cable Harness" is a kind of "ABS Cable Assembly", which is a kind of "ABS Assembly", which is itself a kind of "Brake Assembly". These relations are all taxonomical in nature, even if the "ABS Cable Assembly" is a second order relationship brought in "Assembly" through a dependency between ABS and "Cable", "ABS Cable" and "ABS Cable Assembly".

FIG. 4 illustrates an example of a meronymy that may be used for the fitments and the PIM. In a mechanical context (such as the automotive part example used throughout this disclosure), the meronymy describes functional systems at various levels of physical inclusion. These vehicle systems can be physical mechanisms contained in a confined enclosure, like a "gearbox" or a "carburetor". They can also be "systems" completed through the combination of different contributing mechanisms, like "cooling" or "ignition". In the example in FIG. 4, "Brake Master Cylinder" includes a "Brake Master Cylinder Access Plate", and various other components. These relations are all meronymic in nature.

Vehicle Systems & Universal Parts

The second distinction has to do with the very nature of mechanical systems. They synchronize their constituents to fulfill a functional role within the functional system within which they are themselves embedded: e.g. "Brakes" within the "Vehicle". Some of these constituents are necessary, and others are not required. For example, the second order of components has important functions like assembly or protection.

It seems logical to focus the description of the functional system around its key constituents, and to regroup the second order "helpers" into a "Universal" taxonomy. "Universal Parts" have often a versatile nature which allows them to be used across many different functional systems, making the distinction all the more relevant.

Properties and Constraints

Properties are defined in a specific branch of the ontology, as "genprops" (aka generic properties), that are to actual properties what "genarts" are to articles.

genprops:properties::genarts:articles

Figure 6:
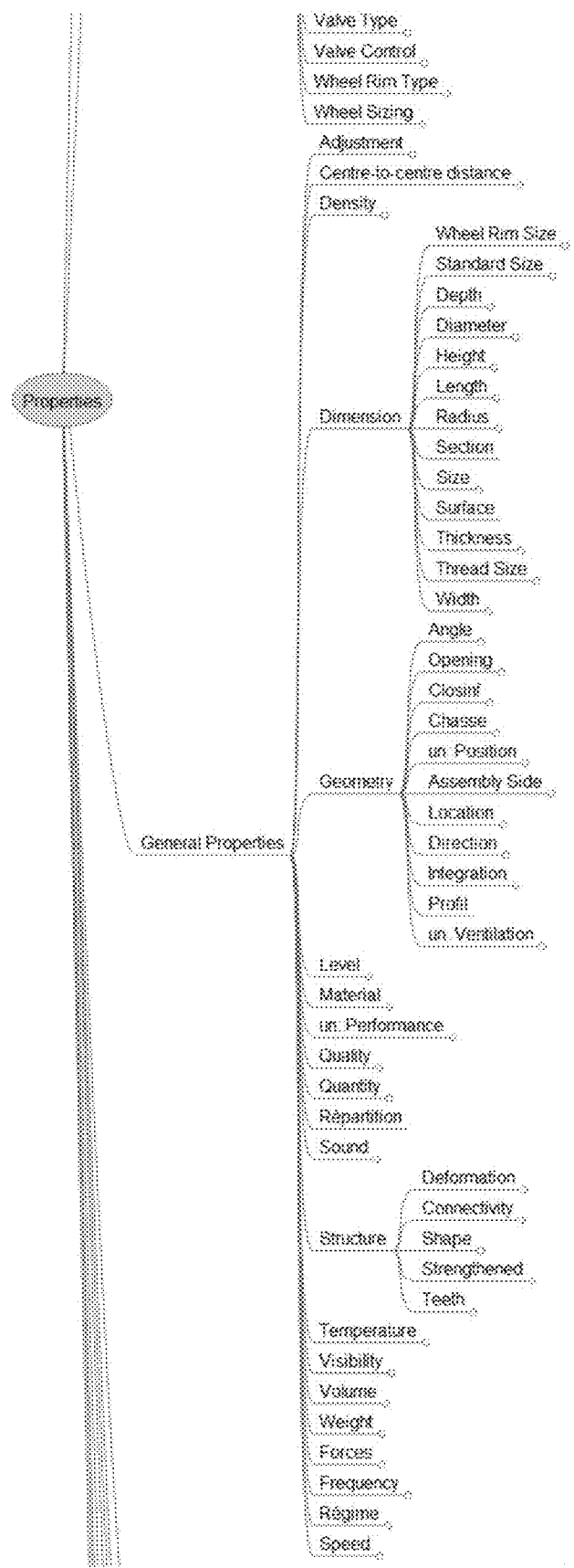

FIGS. 5-6 illustrate examples of a properties ontology that may be used for the fitments and the general format of the properties ontology that is a taxonomy. The property leaves have the following attributes:

Range
  List of values: [23, 37, 44]
  Min-max tuple: (23, 44)
  Also used to represent tolerance brackets (greatest range of variation that can be allowed):
    8±1→(7,9)
Measurement unit
  in, cm, mm, liter, bar (psi), etc.
Constraints FIG. 7 illustrates an example of a constraint. Properties are often found in standard descriptions (e.g. Tecdoc, a European standard for automotive systems) in series, derived from their target as shown in FIG. 7. The two examples in FIG. 7 are very different though, as "disc brake pads" are mechanical components assembled with other components (caliper, etc.) in the brakes system, whereas "teeth" are a physical feature of the related object (e.g. ABS ring). Therefore, it seems more logical to associate a "Quantity" property to disc brake pads, and to create a "Number of Teeth" property associated to ABS ring.

Properties and Constraints

Besides the fact that properties can be "hard coded" to include the feature owned by the object, as in "Number of teeth" (number of features of object), properties can also target directly an object, or target a different object as shown in FIG. 8. "Thickness" is a property of Disc brake, whereas "Number of teeth" is a property of "ABS ring". The latter is acting as a "constraint" of Disc brake. Note that this has nothing to do with the nature of that property, being straightforward (like thickness), or a derivative concept attached to a feature (like number of teeth). If disc brake had for example a "Number of grooves", i.e. a property attached to a core feature of a "Grooved Disc Brake", that property would not be a constraint since it does not involve a different object.

FIG. 9 shows an example set of properties for brakes and all of these properties are triples:

<Object (aka target), Attribute (aka property), Value>

Furthermore, thickness and Number of grooves have an implicit target (Disc brake), whereas Number of teeth needs an explicit target (ABS ring). When the target needs to be explicit, the property is represented as a "constraint" of the related object, and the grouping of properties and constraints is named a "configuration" as shown in FIG. 10.

Vehicles

A vehicle in an automotive parts PIM may have a configuration that regroups the properties and constraints attached to a genart. Only one single configuration can be found for one given genart and some genarts do not have configurations. Configurations are inherited from generic to specific and it true for a meronymy, a taxonomy, vehicle systems and universal parts.

Vehicles and Configurations

Properties provide the middle ground where articles shall meet vehicles to produce fitments. For that fit to happen, vehicle configurations need to meet genarts configurations. Tecdoc (a European standard for automotive systems descriptions) vehicles do not have configurations (except for engine), and AAIA (a US standard for automotive systems descriptions) vehicles only have simplified configurations for all vehicle systems. An example of vehicle properties is shown in FIG. 11.

Ontology vehicles are vehicles equipped with configurations matching all the configurations attached to the vehicle systems covered by the ontology. In order to bootstrap vehicles, fitments are reverse engineered under the assumption that if a fitment binds an article and a vehicle, the known configuration(s) (including inheritance) attached to that article shall match the configuration(s) of that vehicle. Moving forward, new vehicles configurations will be added to the ontology to make sure that they map the articles configurations.

Fitments

Fitments combine 3 sources of information:

1) Part properties and values—these properties and their values are provided by the supplier, and are mapped to the ontology through the 'legacy_of' table as shown in FIGS. 12A and 12B;

2) Part constraints and values—A first group of constraints are provided by the supplier (as properties), and are mapped to the ontology (as constraints) through the 'legacy_of' table and are eventually represented as Target|Property|Value as shown in FIGS. 12A-12B; and 3) A second group of constraints are provided by car mechanics experts. They are associated to genarts and inherited a various levels of hyperonymy. They are asserted a priori and instantiated in the fitment using the values found in the vehicle collections, for that genart and that property.

Fitments need to be checked for completeness. The check for completeness may include:

1) Part properties and values—check that these properties are known in the properties ontology; and check that these properties are associated with the part genart in the vehicle systems ontology.

2) Part constraints and values—Genart constraint=Target genart|Property|Value. Check that these properties are known in the properties ontology. Check that these properties are associated with the Target genart in the vehicle systems ontology. Check that these constraints are associated with the part genart in the vehicle systems ontology.

3) Vehicles systems properties and values—check that these properties are known in the properties ontology. Check that these properties and values are consistent with the part properties and values.

Class, Instances, Fitment

The ontology deals with classes of objects, not actual parts that can fit a vehicle. Ontology classes are instantiated twice: As parts described by each supplier, and as equipment specified by the car manufacturer. Classes have properties and these properties get actual values when the instance is created. This is indeed the core of the instantiation process: A model of class properties becomes a set of valued properties. A part is instantiated within the context of a specific fitment. An equipment is instantiated within the context of a specific vehicle as shown in FIG. 13. Finally, parts valued properties are validated, and valid values are cumulated on the vehicle by disjunctive generalization. Properties are the critical device all along this process, and their representation depends on the type of object embedding them: class or instance.

Class Properties

The properties of a class (both categorical and numerical) are expressed as a conjunctive model for that class.

Class Brake Pad
    PRP::Direction
    PRP::Material
    etc.

Instance Properties

An instance of a class inherits the properties of its class as needed. During that instantiation process, the properties deemed relevant for the instance get a value. That process, although easily accepted for numerical values, e.g. thickness, can seem confusing for categorical values. FIGS. 14-15 illustrates two examples of instance properties. "Front Brake Pad" vs. "Brake Pad" brings us back to the well-known problem of taxonomy/meronymy hierarchical proliferation.

Varietal Expression Control

A typical hierarchy of classes goes from generic to varietal by increment of genericity:

---
Unique beginner
  Life-form
    Generic
      Specific
        Varietal

---

Genericity is expressed by lexical derivation: Specific classes have terms that are derived from generic. The same is true for varietal terms.

There is a major difference though between specific and varietal derivation: Specific terms express stable discrepancies within the generic class, whereas varietal terms are unstable. Depending on the context, various properties (dimensions, material, direction, position, etc.) will justify diverse (and often binary) varietal combinations of categorical dimensions.

The best way to control the combinatorial explosion of varieties is to avoid them altogether. In principle, the properties of any class (both categorical and numerical) can be expressed for that class, and any instance of that class can combine these properties as needed. Hence, the best way to instantiate the previous example is the first form shown in FIG. 16.

Vehicle Instances

The same rationale is true for vehicle equipment instances. These pieces of equipment are expressed through a model inherited from the ontology class, and each equipment instance values categorical and numerical properties as needed as shown in FIG. 17.

If "Brake Pad" is the equipment considered, then each instance of the class "Brake Pad", with its specific combination of instantiated properties, will be listed to define that equipment.

Figure 2:
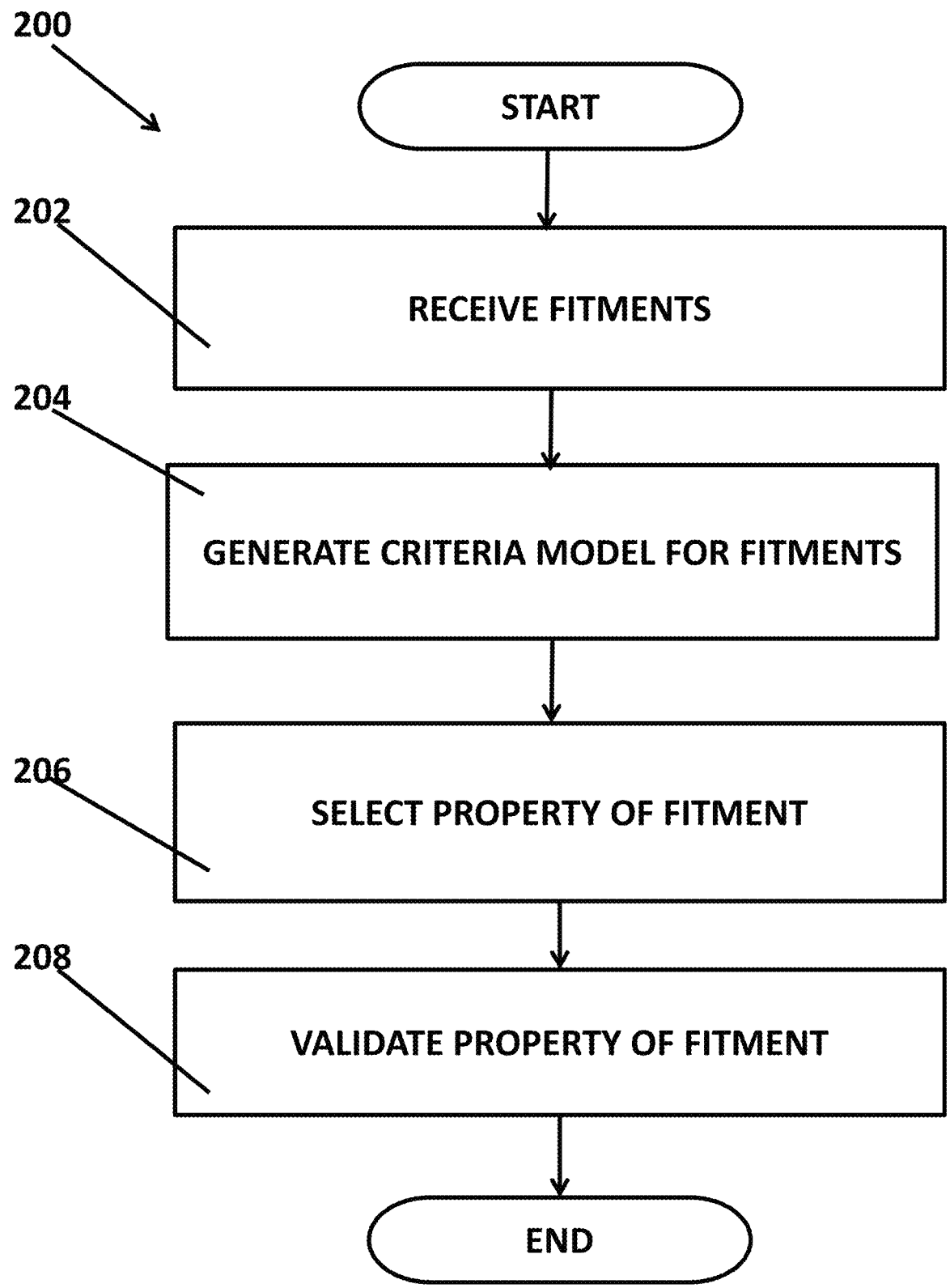
FIG. 2 illustrates a method for fitments validation that may be performed by the system in FIG. 1.
Figure 18B:
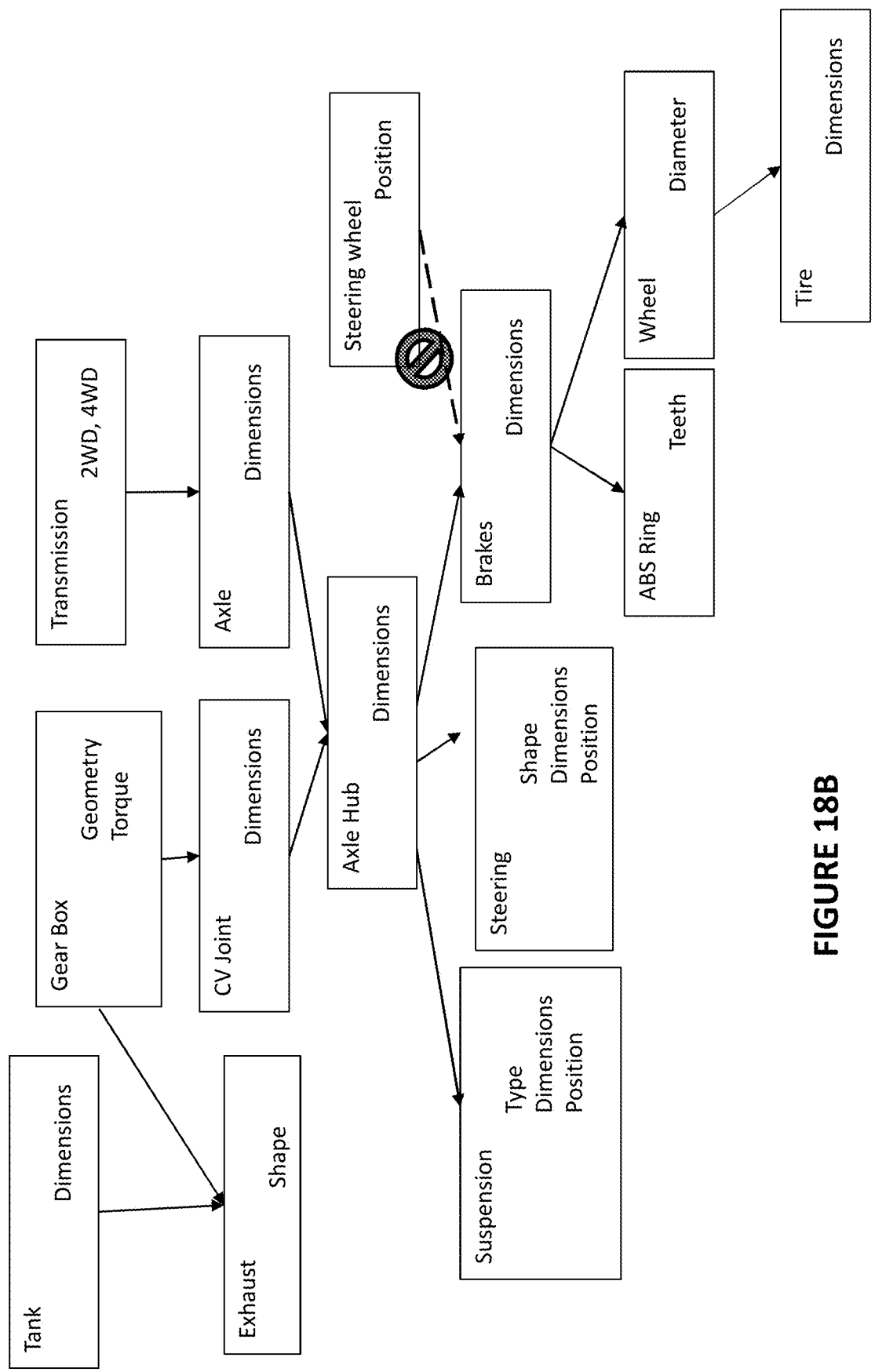
FIG. 18B illustrates an example of a graphically illustrated criteria/causality model for a vehicle.

FIG. 2 illustrates a method 200 for fitments validation that may be performed by the system in FIG. 1. From one fitment to the next, instantiated properties values might be slightly different. Thus, the system may receive the fitments (202) examples of which are shown in the figures and described above. The ontology (described above) may be used to prioritize the properties that define the fitment genart, through "criteria models" (204) that may be generated. In one embodiment, the criteria model (examples of which are shown in FIGS. 18A and 18B) may be generated and attached by car mechanics experts to genarts. A criteria model may also be generated by the fitment validation backend 106 with input from an expert. The system may have a plurality of criteria models in which each criteria model encapsulate the experts' knowledge about vehicle components dependencies such as shown in both FIG. 18A (for a disc brake) and in FIG. 18B (for a vehicle). For example, as shown in FIG. 18B, a chain of components of the powertrain, comprising engine (with exhaust system), transmission, drive shaft, differentials, suspension and the wheels, constitutes one coherent physical system. These components transmit physical constraints of energy and torque that request adequate dimensions and design. It is therefore possible to use the expert's knowledge as a qualitative representation of the physical system of the vehicle. Thus, as shown graphically in FIG. 18B (or could be represented in code form as shown in FIG. 18B), an example of qualitative reasoning about the transmission of dependencies along the driveline exist in which the model starts from the engine that delivers power, and follows components dependencies (gear box, CV joints, axle, axle hubs) down to the final drive (drive wheels and tires). From these qualitative models, "criteria models" can be inferred and maintained, and adapted to the various classes of vehicles.

In one embodiment, the criteria models state which categorical and numerical properties of a genart are deemed the most relevant to assess the accuracy of a fitment related to that genart. As shown in FIG. 18, the criteria model for parts data/genart for a disc brake are shown in which the numerical properties may be diameter and height and the categorical properties may be rotor type and number of holes. For each different part, such as an engine, a transmission or a disc brake, the categorical and numerical properties will be different and those different properties may be used to validate the fitments for each different part and thus the system may store and/or utilize a plurality of criteria models for fitments validation with FIGS. 18A and 18B being two examples.

Using the criteria model, a genart of the part is selected as shown in the exemplary user interface shown in FIG. 19. Then, as shown in the example user interface in FIG. 20, a value of the property against which the fitment is to be validated is selected (206). Then, as each property is selected, the fitment may be validated (208) as described below. In the method, if no outlier is identified by the system, then the fitments data is validated since the characteristics have been checked against each of the vehicles.

Fitment Validation

Given a genart, and a series of fitments, the criteria model provides the key properties that need to be considered to assess the accuracy of the series. In the following example, which traces and makes visible the method processes (implemented in software (a plurality of lines of computer code/instructions executed by a processor) in one embodiment) operations and intelligent decisions, all fitments for disc brakes kits are considered. The criteria model provides 2 key categorical properties: rotor type and number of holes in the disk. The method will review all categorical properties for all generic articles. In the following example tracing of the method decisions in the figures, once 2 configurations have been selected for the 2 categorical properties, the first 2 numerical properties (diameter and height) show a range of possible values that will be considered by the method. Once a value of 68 is selected for the centering diameter (out of 2 values found in the series), the user interface (based on the PIM data) shows only one minimal thickness value, and one height value. The other height value is filtered out as an outlier by the software. That outlier has been proposed by the supplier as a fit for the Audi S4 Quattro, and that fitment is indeed an error, that will be rejected by the method.

Cumulative Learning

After validation, all properties ranges across all fitments series are retrofitted in the vehicle database, so that the car mechanics expert do not need to double-check patent outliers the next time the fitments database is updated.

Figure 22:
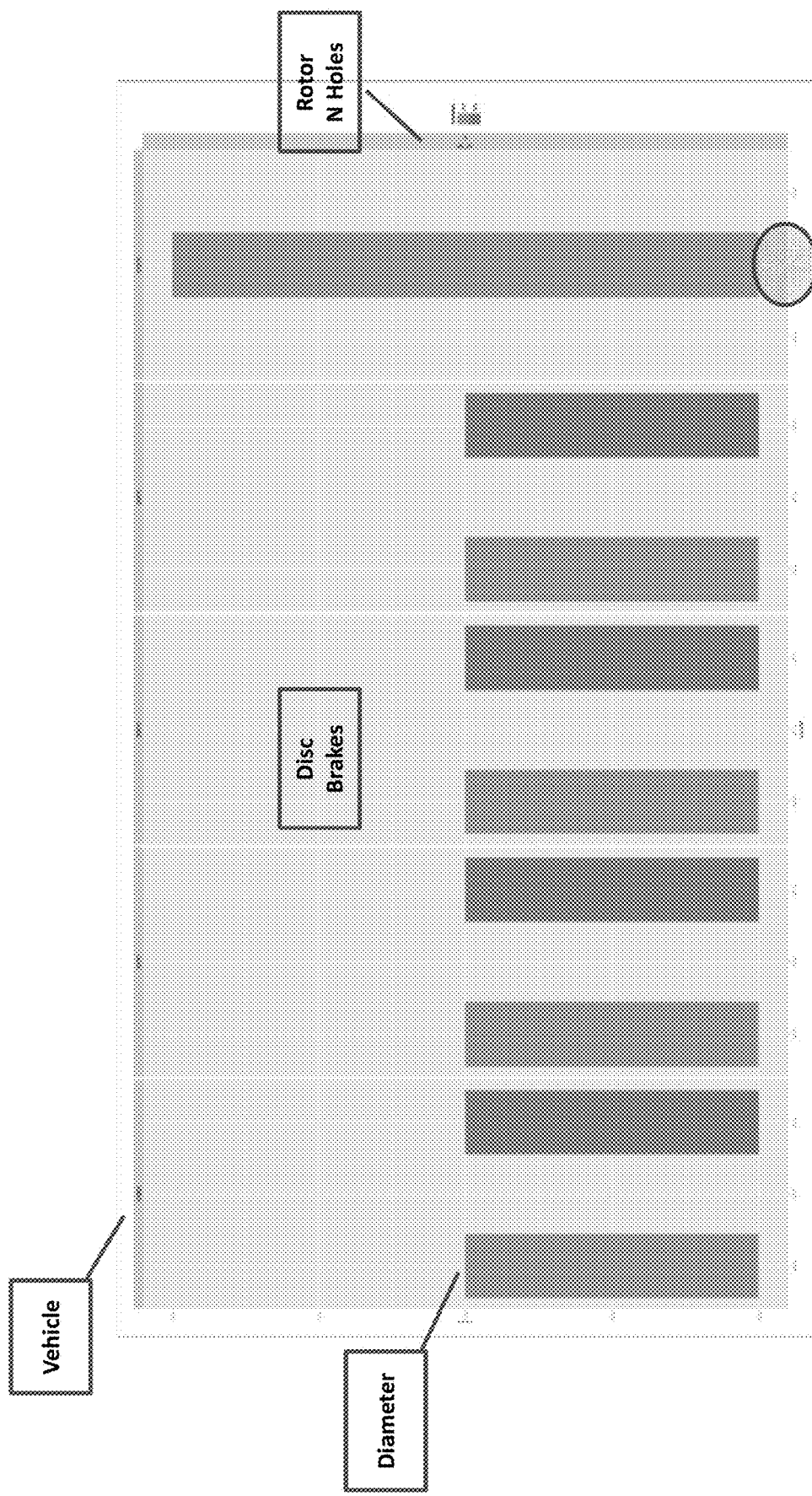
FIG. 22 illustrates an example of a user interface of the system that shows the outlier fitments data.

FIG. 22 illustrates an example of a user interface of the system that shows the outlier fitments data. As shown in FIG. 22, the output of the system may be a representation of the fitment data (disc brakes with rotors and holes in the example in FIG. 22). The representation of the fitments data may be in bar chart form as shown in FIG. 22 or any other form that graphically illustrates the values of the fitments data. The user interface may display the fitments data for a plurality of different vehicles (with five vehicles shown in the example in FIG. 22). As shown in the example, the user can visually see from the user interface that the fitments data for the vehicle on the right side of the chart is an outlier and incorrect. Thus, the fitment validation system receives the fitment data, applies programmatic processes to analyze the fitments data and generates the user interfaces that allow the user to determine that the fitments data is not correct so that the fitments data may be modified.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

The system and method disclosed herein may be implemented via one or more components, systems, servers, appliances, other subcomponents, or distributed between such elements. When implemented as a system, such systems may include an/or involve, inter alia, components such as software modules, general-purpose CPU, RAM, etc. found in general-purpose computers. In implementations where the innovations reside on a server, such a server may include or involve components such as CPU, RAM, etc., such as those found in general-purpose computers.

Additionally, the system and method herein may be achieved via implementations with disparate or entirely different software, hardware and/or firmware components, beyond that set forth above. With regard to such other components (e.g., software, processing components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to: software or other components within or embodied on personal computers, servers or server computing devices such as routing/connectivity components, handheld or laptop devices, multiprocessor systems, microprocessor-based systems, set top boxes, consumer electronic devices, network PCs, other existing computer platforms, distributed computing environments that include one or more of the above systems or devices, etc.

In some instances, aspects of the system and method may be achieved via or performed by logic and/or logic instructions including program modules, executed in association with such components or circuitry, for example. In general, program modules may include routines, programs, objects, components, data structures, etc. that perform particular tasks or implement particular instructions herein. The inventions may also be practiced in the context of distributed software, computer, or circuit settings where circuitry is connected via communication buses, circuitry or links. In distributed settings, control/instructions may occur from both local and remote computer storage media including memory storage devices.

The software, circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules and/or other components. Further, communication media may include wired media such as a wired network or direct-wired connection, however no media of any such type herein includes transitory media. Combinations of the any of the above are also included within the scope of computer readable media.

In the present description, the terms component, module, device, etc. may refer to any type of logical or functional software elements, circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive, etc.) to be read by a central processing unit to implement the functions of the innovations herein. Or, the modules can comprise programming instructions transmitted to a general purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, features consistent with the disclosure may be implemented via computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe specific hardware components, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may also be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) though again does not include transitory media. Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the applicable rules of law.

While the foregoing has been with reference to a particular embodiment of the disclosure, it will be appreciated by those skilled in the art that changes in this embodiment may be made without departing from the principles and spirit of the disclosure, the scope of which is defined by the appended claims.

The invention claimed is:

1. A method, comprising:
   receiving automotive parts data, the automotive parts data including data about a plurality of automotive parts for a plurality of vehicles, data about one or more properties of each automotive part, data about a fitment for each automotive part to a particular vehicle and data about each of the plurality of vehicles;
   retrieving a criteria model for a particular automotive part from the automotive parts data, the criteria model identifying one or more properties of the particular automotive part for assessing an accurate fitment for the particular automotive part;
   identifying, using the fitment for the particular automotive part and the criteria model for the particular automotive part, whether an outlier in the fitment for the particular automotive parts data is present;

validating the fitment for the particular automotive part if no outlier is identified; and updating the fitment for the particular automotive part if an outlier is identified so that the updated fitment is validated.

2. A method, comprising:

receiving automotive parts data, the automotive parts data including data about a plurality of automotive parts for a plurality of vehicles, data about one or more properties of each automotive part, data about a fitment for each automotive part to a particular vehicle and data about each of the plurality of vehicles;

retrieving a criteria model for a particular automotive part from the automotive parts data, the criteria model identifying one or more properties of the particular automotive part for assessing an accurate fitment for the particular automotive part;

identifying, using the fitment for the particular automotive part and the criteria model for the particular automotive part, whether an outlier in the fitment for the particular automotive parts data is present;

generating the retrieved criteria model using an ontology to identify one or more properties for the fitment that are used to validate the fitment; and validating the fitment for the particular automotive part if no outlier is identified.

3. The method of claim 2, wherein the one or more properties are one of a categorical property and a numerical property.

4. A method, comprising:

receiving automotive parts data, the automotive parts data including data about a plurality of automotive parts for a plurality of vehicles, data about one or more properties of each automotive part, data about a fitment for each automotive part to a particular vehicle and data about each of the plurality of vehicles;

retrieving a criteria model for a particular automotive part from the automotive parts data, the criteria model identifying one or more properties of the particular automotive part for assessing an accurate fitment for the particular automotive part;

identifying, using the fitment for the particular automotive part and the criteria model for the particular automotive part, whether an outlier in the fitment for the particular automotive part is present, wherein identifying the outlier further comprises generating a user interface that displays the fitment data for each vehicle to graphically display the outlier; and validating the fitment for the particular automotive parts data if no outlier is identified.

5. An apparatus, comprising:

a computer system having a processor and a memory;

a storage device associated with the computer system that stores automotive parts data, the automotive parts data including data about a plurality of automotive parts for a plurality of vehicles, data about one or more properties of each automotive part, data about a fitment for each automotive part to a particular vehicle and data about each of the plurality of vehicles;

the processor executing a plurality of lines of instructions and the processor is configured to retrieve a criteria model for a particular automotive part from the automotive parts data, the criteria model identifying one or more properties of the particular automotive part for assessing an accurate fitment for the particular automotive part;

the processor executing a plurality of lines of instructions and the processor is configured to identify, using the fitment for the particular automotive part and the criteria model for the particular automotive part, whether an outlier in the fitment for the particular automotive parts data is present;

the processor executing a plurality of lines of instructions and the processor is configured to validate the fitment for the particular automotive part if no outlier is identified; and wherein the processor is configured to update the fitment for the particular automotive part if an outlier is identified so that the updated fitment is validated.

6. An apparatus, comprising:

a computer system having a processor and a memory;

a storage device associated with the computer system that stores automotive parts data, the automotive parts data including data about a plurality of automotive parts for a plurality of vehicles, data about one or more properties of each automotive part, data about a fitment for each automotive part to a particular vehicle and data about each of the plurality of vehicles;

the processor executing a plurality of lines of instructions and the processor is configured to retrieve a criteria model for a particular automotive part from the automotive parts data, the criteria model identifying one or more properties of the particular automotive part for assessing an accurate fitment for the particular automotive part;

the processor executing a plurality of lines of instructions and the processor is configured to identify, using the fitment for the particular automotive part and the criteria model for the particular automotive part, whether an outlier in the fitment for the particular automotive parts data is present;

the processor executing a plurality of lines of instructions and the processor is configured to validate the fitment for the particular automotive parts data if no outlier is identified; and wherein the processor is configured to generate the retrieved criteria model using an ontology to identify one or more properties for the fitment that are used to validate the fitment.

7. The apparatus of claim 6, wherein the one or more properties are one of a categorical property and a numerical property.

8. An apparatus, comprising:

a computer system having a processor and a memory;

a storage device associated with the computer system that stores automotive parts data, the automotive parts data including data about a plurality of automotive parts for a plurality of vehicles, data about one or more properties of each automotive part, data about a fitment for each automotive part to a particular vehicle and data about each of the plurality of vehicles;

the processor executing a plurality of lines of instructions and the processor is configured to retrieve a criteria model for a particular automotive part from the automotive parts data, the criteria model identifying one or more properties of the particular automotive part for assessing an accurate fitment for the particular automotive part;

the processor executing a plurality of lines of instructions and the processor is configured to identify, using the fitment for the particular automotive part and the criteria model for the particular automotive part, whether an outlier in the fitment for the particular automotive parts data is present;

the processor executing a plurality of lines of instructions and the processor is configured to validate the fitment for the particular automotive part if no outlier is identified; and wherein the processor is configured to generate a user interface that displays the fitment data for each vehicle to graphically display the outlier.

* * * * *